United States Patent [19]

Micheron et al.

[11] Patent Number: 4,782,227

[45] Date of Patent: Nov. 1, 1988

[54] IMAGE SENSOR WITH MEMORY

[75] Inventors: François Micheron, Gif sur Yvette; Dominique Broussoux, Marcoussis; Jacques Trotel, Palaiseau, all of France

[73] Assignee: Thomson-CSF, Paris, France

[21] Appl. No.: 17,584

[22] Filed: Feb. 24, 1987

[30] Foreign Application Priority Data

Feb. 25, 1986 [FR] France ............... 86 02582

[51] Int. Cl.$^4$ .............................................. G03G 5/16
[52] U.S. Cl. .............................. 250/327.2; 250/211 R; 250/578; 358/111
[58] Field of Search ............... 250/211 J, 211 R, 578, 250/336.1, 327.2; 365/109, 110; 358/111

[56] References Cited

U.S. PATENT DOCUMENTS

| | | | |
|---|---|---|---|
| 3,148,354 | 9/1964 | Schaffert | 365/110 |
| 3,601,610 | 8/1971 | Nakamura | 250/211 R |
| 3,681,765 | 8/1972 | Chapman | 250/211 R |
| 3,681,766 | 8/1972 | Chapman et al. | 250/211 R |
| 3,693,171 | 9/1972 | Asam | |
| 3,975,637 | 8/1976 | Ikedo et al. | 250/327.2 |
| 4,142,206 | 2/1979 | Ennulat | |
| 4,268,750 | 5/1981 | Cowart | |
| 4,508,966 | 4/1985 | Oberschmid et al. | 250/327.2 |
| 4,521,808 | 6/1985 | Ong et al. | 358/111 |

FOREIGN PATENT DOCUMENTS 0109712  5/1984  European Pat. Off. .
2136314  1/1972  Fed. Rep. of Germany .

OTHER PUBLICATIONS

Ferroelectrics, vol. 10, 1976, pp. 15–18, London, GB; F. Micheron et al.: "A Ferroelectric Image Memory".

Primary Examiner—Edward P. Westin
Assistant Examiner—Khaled Shami
Attorney, Agent, or Firm—Oblon, Fisher, Spivak, McClelland, & Maier

[57] ABSTRACT

Image sensor with memory and, more especially, image sensor with reading by thermal effect.

This sensor comprises mainly a layer of a photoconductive material and a layer of a transparent material, the impedance of which varies with the temperature, these two layers being comprised between two electrodes. Furthermore, a voltage generator can be connected to the electrodes during the recording when the device is illuminated. Finally, a charge amplifier can be used to detect a current when the unit is heated.

13 Claims, 4 Drawing Sheets

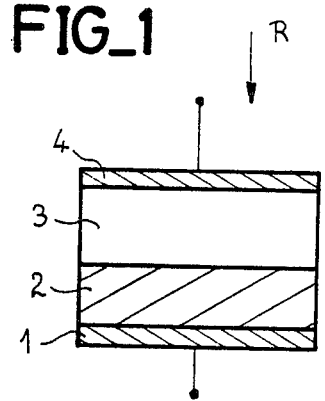
FIG_1
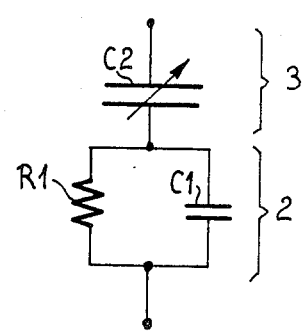
FIG_2
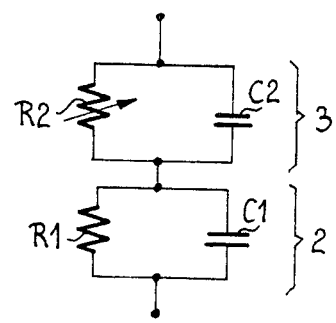
FIG_3
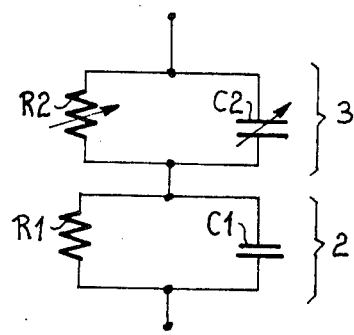
FIG_4

FIG_5
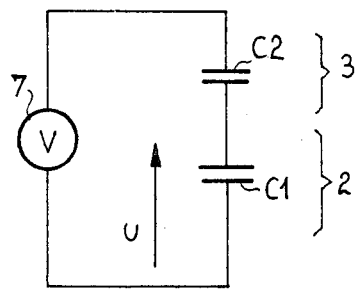
FIG_6
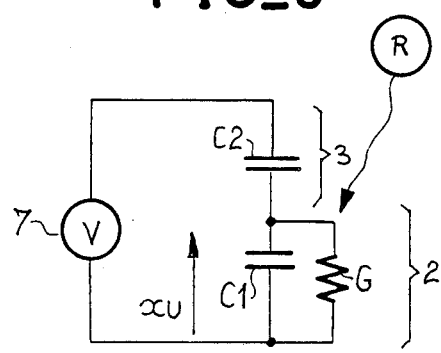
FIG_7
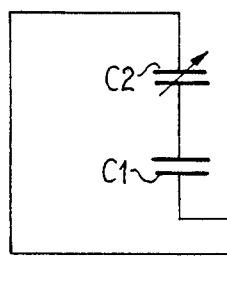
FIG_8
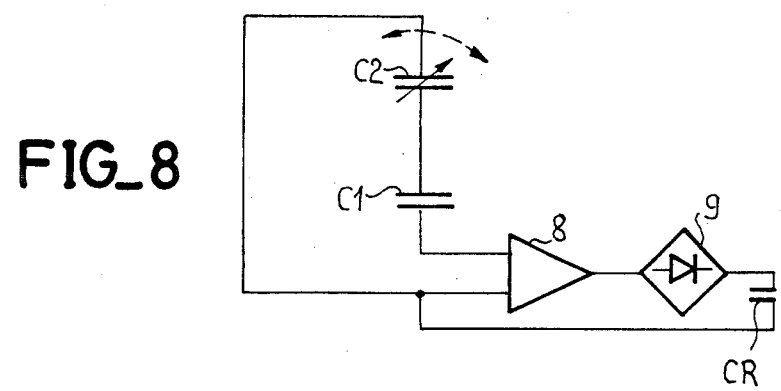

FIG_9
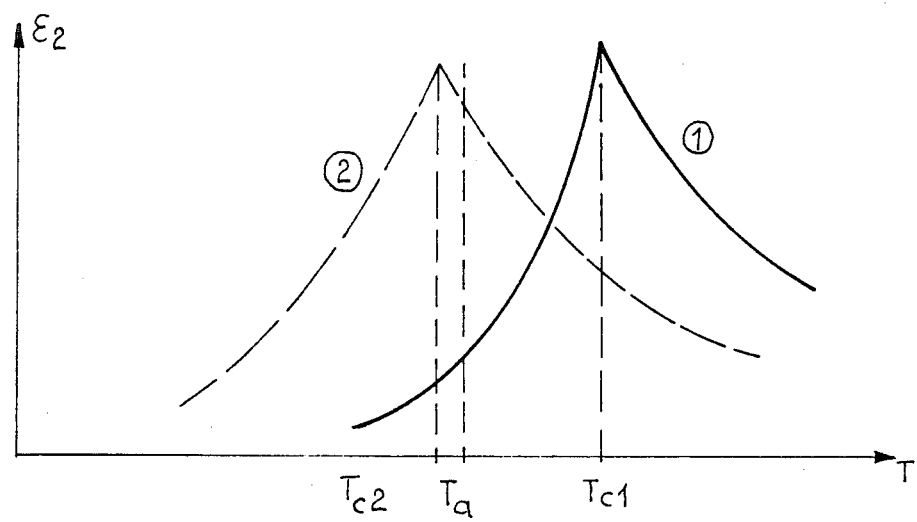
FIG_10
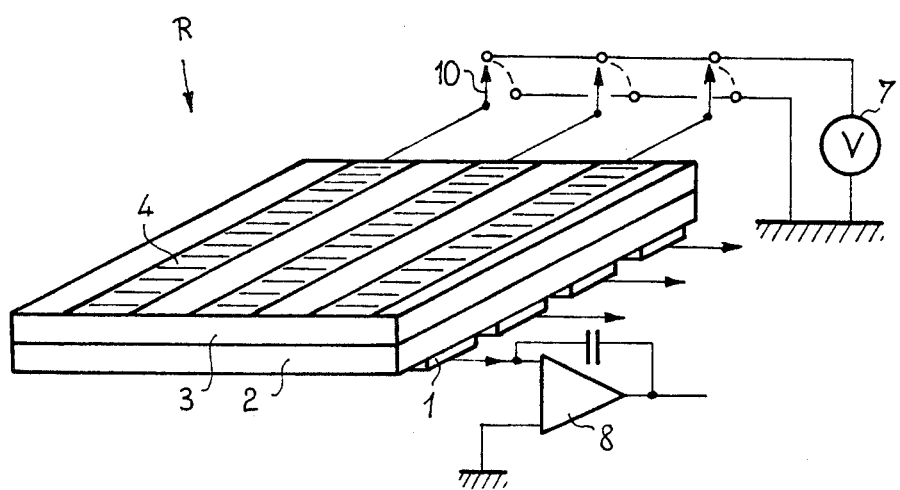

FIG_11
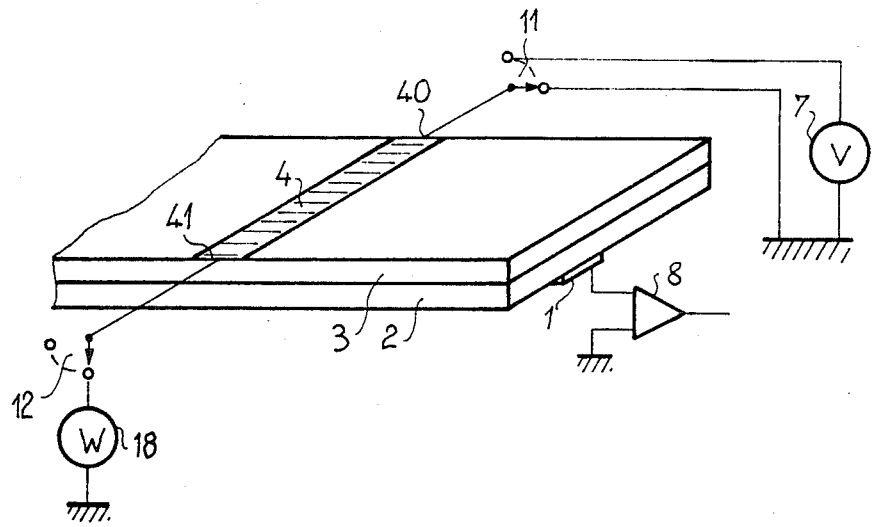
FIG_12
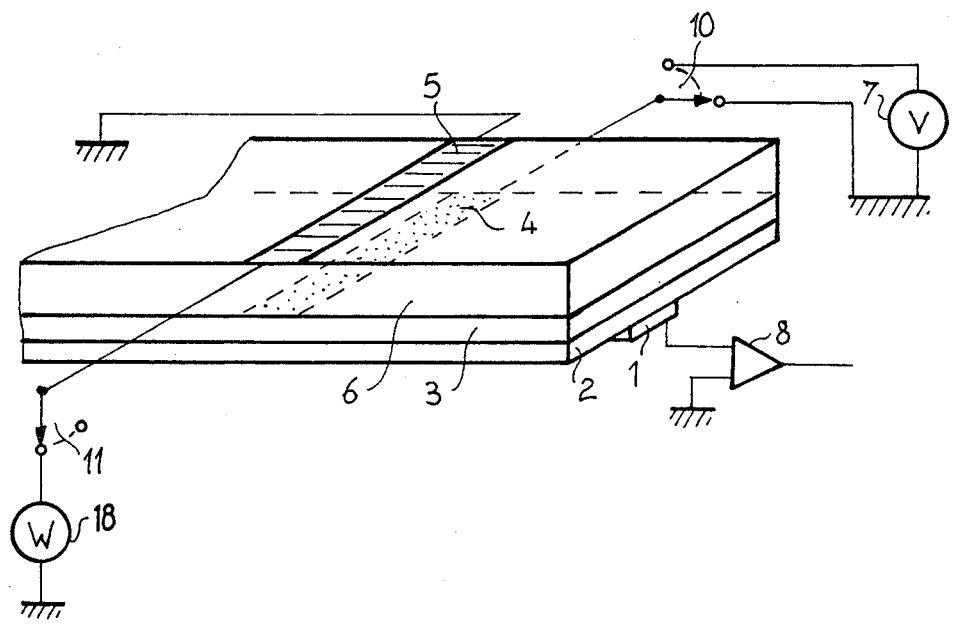

IMAGE SENSOR WITH MEMORY

BACKGROUND OF THE INVENTION

The invention pertains to a image sensor with memory and more especially to an image sensor with memory with reading by thermal effect.

The field of the invention is that of image sensors with memory combining a photoconductor and a dielectric wherein the addressing during reading is done by laser-beam scanning, the said laser beam setting up, in a circuit containing the sensor, a photocurrent which is proportionate to the illumination received at the addressed point. Two publications are relevant in this field. They are:

(1) "A Ferroelectric Image Memory" by F. MICHERON, J. M. ROUCHON and M. VERGNOLLE (THOMSON CSF) published in Ferroelectrics 10, 15 (1976)

(2) U.S. Pat. No. 4,446,365 filed on May 1, 1984, with the title of "Electrostatic Imaging Method" by P. S. ONG, A. ZERMENO, L. M. MARSH and J. M. HEVEZI The first of these publications describes an image sensor wherein the photoconductor is associated with a ferroelectric dielectric. When recording, since the ferroelectric is initially in the macroscopically depolarized state, well above its Curie point temperature (random direction of the polar axes of the microcrystals which constitute it), it is subjected simultaneously to the application, via the photoconductor, of a voltage greater than the coercitive voltage and to the projection of the image to be recorded. In the highly illuminated zones the voltage is applied, in totality, to the ferroelectric, and the crystals take a direction. In the grey zones, the rate at which the direction is taken depends on the illumination received. This results in a replica of the image in the ferroelectric, recorded in the form of a spatial distribution of polarization, and this image is permanent for as long as the ferroelectric is not heated to its Curie point temperature or for as long as it is not subjected to the coercitive voltage. The reading is done by scanning with a laser beam, either on the photoconductive side (in this case, there flows, in the external circuit, a photocurrent caused by the displacement of the photocarriers which neutralizes the space charge created by the ferroelectric at the interface) or on the ferroelectric side, in which case a current of pyroelectric or photoferroelectric origin flows in the circuit. These currents constitute the video signal sent to a cathode-ray tube display device, scanned in synchronism with the laser scanning, hence the restitution of the image. It will be noted that, in this type of image memory, the reading is nondestructive.

The latter of the two publications cited above pertains to the same principle, except that the dielectric does not have the property of memory and that the reading brings into play only the mode of neutralization of the space charge by the illuminated photoconductor. In this case, the storage time of the recorded image depends on the natural discharge, time constants (Maxwell's relaxation) of the photoconductor and the dielectric. Finally the reading is destructive.

The image sensor proposed in the present patent application is intermediary between the two preceding sensors since the reading is nondestructive and since the storage time is monitored by the Maxwell relaxation time of the photoconductor and the dielectric. The reading is done through the impedance variation induced thermally in the dielectric. The physical bases of this mode of reading are explained in the following publication:

(3) "Propriétés et Applications des Dielectrics Polarisés: Electrets, Polymers Orientés et Ferroelectrics" (Properties and Applications of Polarized Dielectrics: Electrets, Directed Polymers and Ferroelectrics), by F. MICHERON, in the *Revue Technique THOMSON CSF*, No. 10, p. 445 (1978).

SUMMARY OF THE INVENTION

The invention therefore pertains to an image sensor with memory comprising:

A first electrode made of a conductive material;

A first layer of a photoconductive material in contact with the first electrode;

A second transparent layer of a material with an impedance which is variable with the temperature, the said second layer being juxtaposed with the first layer of photoconductive material;

A second transparent electrode made of a conductive material in contact with the said second layer, a recording voltage generator which can be connected with the said first and second electrodes;

A charge amplifier, two inputs of which can be connected to the said first and second electrodes, and one output of which is connected to a charge sensor; with a first change-over switch making it possible to connect the recording voltage generator or the charge amplifier, at choice, to the said first and second electrodes;

And a heating means by which it is possible to heat the second layer at least at the location between the two said electrodes.

The invention also pertains to a method for sensing image memories in which the sensor has been exposed to radiations determining, in the first layer of the photoconductive material, a distribution of charges wherein this distribution of charges is read by heating the second layer of material which has variable impedance.

BRIEF DESCRIPTION OF THE DRAWINGS

The various objects and characteristics of the invention will appear more clearly from the following description, given as an example and made with reference to the appended figures, wherein:

FIG. 1 depicts an example of a mode of embodiment of the sensor of the invention;

FIGS. 2 to 4 depict possible equivalent electric circuits of the sensor of the invention;

FIGS. 5 and 6 are electrical operating diagrams of the sensor of the invention in a recording stage;

FIGS. 7 and 8 are electrical operating diagrams of the sensor of the invention in a reading stage;

FIG. 9 represents variation curves of the permittivity, as a function of the temperature, of ferroelectric, dielectric materials;

FIG. 10 depicts an example of a mode of embodiment of an image sensor according to the invention made in the shape of a screen;

FIG. 11 depicts an alternative mode of embodiment of the image sensor according to the invention, in which a heating electrode also acts as a reading electrode;

FIG. 12 depicts another alternative mode of embodiment of the image sensor according to the invention, in which the heating electrode is separated from a reading electrode by an insulating layer.

DETAILED DESCRIPTION OF THE INVENTION

According to the invention, the photosensitive element is a photoconductive material and the reading element is a material with an impedance which depends on the temperature, associated with a heating means. The sensor may be of the punctiform type, or it may be linked in a row of punctiform elements to form a strip or it may be linked in a matrix of punctiform elements to form a retina or a plane. In the third case, the heating means is spatially selective, it being possible to shift the thermally-addressed zone on the surface of the retina to enable the data contained in the said zone to be output in parallel. The photoconductive material is chosen according to the energy of the radiation to be sensed, from the infrared, through the visible part of the spectrum and the X-rays up to the high-energy particles (MeV).

FIG. 1 thus depicts a sensor according to the invention comprising:

One layer 2 of a photoconductive material;

One layer 3 of a material, the impedance of which varies with the temperature;

Two electrodes 1 and 4, located on either side of the layers 2 and 3, each of which is in contact with one of these layers.

The sensor is illuminated, during a recording, by a radiation indicated by the arrow R. The electrode 4 which receives this radiation is transparent to the wavelength of the radiation as is the layer 3 of the material with variable impedance.

The photoconductive layer 2 for the radiation level considered is metallized on the lower surface (not subjected to radiation) by the electrode 1. Its upper surface is lined with the layer 3 of the material which has an impedance of that varies with the temperature. The material of the layer 3 and the upper electrode 4 thus obtained are transparent to the radiation considered.

In a preferred mode of embodiment of the invention, the material of the layer 3 is a dielectric, the permittivity of which varies greatly with the temperature; it is a dielectric such as ferroelectrics or other dielectrics (for example, camphor and its derivatives) brought very close to their point of structural transition. A sensor is then obtained, the equivalent electric diagram of which is depicted in FIG. 2 with the photoconductor 2 represented by the resistor R1 and the capacitor C1 in parallel, and the layer 3 of the dielectric material represented by a variable capacitor C2.

According to another mode of embodiment of the invention, it is the conductivity of the dielectric which may vary (increase) with the temperature. We thus obtain, as depicted in FIG. 3, for the layer 3, a capacitor C2 and a variable resistor R2.

According to a third mode of embodiment, the layer 3 of the dielectric material may have its permittivity and its conductivity increase proportionately with the temperature. We then obtain an equivalent electrical diagram with the layer 3 represented by a variable capacitor C2 and a variable resistor R2.

In all cases, the layer 3 of dielectrical material is considered to have zero conductivity at the image recording temperature.

In the following description, it is the thermodielectric mode (variation of permittivity with temperature) which will be first considered. By the same token, it will be assumed that the conductivity of the photoconductor is zero except during illumination.

The recording principle, which is known per se, consists in obtaining, at the dielectric/photoconductor interface, a density of charges which depends on the illumination. Several modes are possible such as those described, for example, in "Electrophotography" by R. M. SCHAFFERT, Ed. Focal Press, 1971, as well as in the U.S. Pat. No. 4,446,365 referred to above. One such mode consists in applying a voltage V to the entire system during exposure and then in short-circuiting it after exposure.

In the initial state depicted in FIG. 5, the potential applied being V, the interface potential may be written as follows:

$$u = V \frac{C_2}{C_1 + C_2}$$

However, when using other means, it is possible to raise this potential u.

When the photoconductor 2 is subjected to the radiation R (FIG. 6), with the voltage V being applied, the potential u decreases, owing to the conductivity —(I) of the photoconductor:

we get: $\sigma(I) = \alpha_x \mu \tau_p \eta N$ with: $\alpha_x$: absorption coefficient of photoconductor under X-radiation $\mu$ and $\tau_p$: respectively, mobility and lifetime of photocarriers $\eta$: yield of photoconductivity equivalent to the number of photocarriers/number of absorbed photons N: surface density of impinging photons per second equivalent to I/h v (I in watts per square meter)

The time constant t of decrease is equal to the ratio of the capacities of the capacitors in parallel and the conductance G of the photoconductor. The layers of thermodielectric and photoconducting materials have the same area: their thicknesses and permittivity are respectively $e_1$, $\epsilon_1$ and $e_2$ and $\epsilon_2$:

whence $$u = V \frac{\epsilon_2 e_1}{e_1 \epsilon_2 + e_2 \epsilon_1}$$

$$\tau = \frac{C_1 + C_2}{G} = \frac{e_2 \epsilon_1 + e_1 \epsilon_2}{e_2 \tau} \quad (I)$$

The potential at the interface after exposure for a time t is then:

$$u_t = u \, exp - \frac{t}{\tau} = x \, u$$

After exposure, the electrodes are put in short circuit. The charge of the two capacitors is distributed in the totalized capacity, whence the voltage $u_x$ at the interface:

$$C_2(V - u_t) - C_1 u_t = -(C_1 + C_2) u_x$$

giving: $u_x = -\frac{C_2 V}{C_1 + C_2}(1 - x) = -\frac{C_2 V}{C_1 + C_2}(1 - e^{-t/\tau})$ According to a second mode of recording, this potential V is applied to the entire system which is exposed uniformly for a period of time which is sufficient for the potential u to fall to zero; the potential V is brought to zero. It follows from this that the potential is:

$$u' = -\frac{C_2 V}{C_1 + C_2} = u_x(t_\infty).$$

The sensor is exposed for a time t to radiation such that the potential at the interface becomes:

$$u'_x = -\frac{C_2 V}{C_1 + C_2} e^{-t/\tau}$$

It appears therefore that $u_x$ and $u'_x$ are complementary $$u_x + u'_x = -\frac{C_2 V}{C_1 + C_2}$$

This means that the two images corresponding to the two modes of recording referred to have reversed contrasts. As an example, the first mode of recording will be chosen in the following part of the description. At low exposure times, we get:

$$u_x = -\frac{C_2 V}{C_1 + C_2} \frac{t}{\tau}$$

Introducing the values of $\tau$ and u, $$|u_x| = u \frac{C_2}{(C_1 + C_2)2} GVt = \frac{Gut}{C_1 + C_2}$$

Now Gu is the photoconduction current i and i.t. is the electronic charge $Q_x$ displaced under irradiation for the time t. It is thus ascertained that whatever may be the values of $C_1$ and $C_2$, $$(C_1 + C_2)u_x = Q_x$$

We have thus described how the sensor of the invention makes it possible to record an image.

Referring to FIGS. 7, 8 and 9, we shall now describe the method for thermodielectric reading of the sensor of the invention.

The latent image is recorded in the form of a spatial distribution of charges at the interface, that is $q_x = (C_1 + C_2)u_x$ or $q_x = -C_2 V(L-x)$. In the case of the punctiform sensor, the device is connected to a charge amplifier. Assuming that the capacity of the capacitor $C_2$ of the dielectric is made to vary (by varying the thickness or permittivity), the calculation made in the document "Propriété et Applications des Dielectriques Polarisés: Electrets, Polymers Orientés et Ferroélectriques" by F. MICHERON referred to above shows that the charge measured is proportionate to the relative variation of the capacity. This mode of reading, as depicted in FIG. 7, is similar to parametric amplification, the gain coming from the energy source needed to make the capacity vary. It is seen that this reading mode is nondestructive: if the capacity $C_2$ varies alternately around its mean value, the charge collected varies with the same frequency. It follows that by rectifying the signal coming from the charge amplifier in two alternations, this rectified signal can charge a storage capacitor CR in proportion to the number of cycles of the variable capacity, whence a gain in the signal-to-noise ratio.

A mode of functioning of this type is obtained with the circuit of the FIG. 8 where a rectifier bridge 9 connected to the amplifier 8 is used to charge the capacitor CR.

Rather than make the capacity of the capacitor $C_2$ vary electrically (by a Varicap diode, a ferroelectric dielectric close to its Curie point temperature or to the coercitive field) or mechanically, we propose to make it vary by thermal means, by heating: this heating can be obtained by the absorption of light energy or by Joule effect. The advantage of thermodielectric switching lies in the fact that the recording circuits and the reading circuits are quite uncoupled. Furthermore, the switching noise can be reduced as compared with an electrical switching of a non-linear element (such as plasma, varistor etc.).

Major variations in permittivity by heating can be obtained in ferroelectric dielectrics: increase when $T_a < T_c$, decrease when $T_a > T_c$ as shown by the curves 1 and 2 of FIG. 9. Since these dielectrics must be transparent to the radiation to be sensed, polymers such as P(VF$_2$/TrFE) are well suited to this purpose (with a min. to max. permittivity ratio of 5 to 10), all the more so as they can be obtained on large homogeneous surfaces.

Since the calculation referred to earlier, published in "Proprieté et Applications des Dielectriques Polarisés: Electrets, Polymers Orientés et Ferroéléctriques" by F. MICHERON, is a variational calculation, it is not suited to the case of large variations in capacities being considered here.

The charge of the two capacitors $C_1$ and $C_2$ is constant,

Let $Q_x = (C_1 + C_2)u_x$

Let $u_xm$ and $u_xM$ be the interface voltages corresponding respectively to the minimum value $C_2m$ and the maximum value $C_2M$ of the capacity:

$$Q_x = (C_1 + C_2^m)u_x^m = (C_1 + C_2^M)u_x^M$$

The charge read by variation of the capacitor $C_2$ is:

$$\begin{aligned}
q_x &= C_1[u_x^m - u_x^M] \\
&= C_1 u_x^m \frac{C_2^M - C_2^m}{C_1 + C_2^M} \\
&= C_1 u_x^M \frac{C_2^M - C_2^m}{C_1 + C_2^m}
\end{aligned}$$

The ratio of the charge read $q_x$ to the charge stored $Q_x$ is:

$$S = \frac{C_1}{C_1 + C_2^m} \cdot \frac{C_2^M - C_2^m}{C_1 + C_2^M}$$

To optimize the value of the ratio S, the value of the capacity of the capacitor $C_1$ will be selected by assuming:

$$\alpha = \frac{C_2^M}{C_2^m} \text{ et } \beta = \frac{C_2^m}{C_1}$$

$$S = \frac{\beta}{1 + \beta} \frac{\alpha - 1}{1 + \alpha \beta}$$

-continued $$\frac{dS}{d\beta} = (\alpha - 1)\frac{1 - \alpha\beta^2}{(1 + \beta)^2(1 + \alpha\beta)^2}$$

Thus, S is maximum for $\alpha\beta^2=1$ whence the corresponding value of $C_1$ is given by $C_1^2 \text{ opt}=C_2^m C_2^M$ and $S \max = \dfrac{\alpha - 1}{(1 + \sqrt{\alpha})^2}$ The fluctuation of max with that of $\alpha$ is:

$$\frac{dS \max}{d\alpha} = \frac{2}{(1 + \sqrt{\alpha})^3}$$

hence the table giving the values of S max ($\alpha$) and $\dfrac{ds \max}{d\alpha}$.

| $\alpha$ | 1 | 2,5 | 7 | 10 | 25 | 100 | $\infty$ |
|---|---|---|---|---|---|---|---|
| s max | 0 | 0,225 | 0,45 | 0,52 | 0,67 | 0,82 | 1 |
| $\dfrac{ds\ max}{d\alpha}$ | 0,25 | 0,12 | 0,04 | 0,03 | 0,01 | $1,5\ 10^{-3}$ | 0 |

It can be seen from this table that the reading efficiency is all the greater and all the less affected by a fluctuation in—as—is great.

It will now be assumed, in the rest of the description, that the detector is not punctiform and has dimensions of 40×40 cm2 for example. It may then be considered to comprise a set of almost-punctiform sensor elements arranged in the form of a matrix, each sensor element being located at the intersection of a row and a column. The resolution of a sensor of this type may be 200 microns, and may comprise 2000 rows deposited under the photoconductor and 2000 columns deposited on the dielectric.

FIG. 10 shows an example of a mode of embodiment of a sensor of this type. This sensor comprises a plane layer of a photoconductive material 2 and a layer 3 of a material, the impedance of which varies with the temperature.

The free side of the layer 2 has electrodes such as the electrode 1 which are linear and parallel with one another. These electrodes 1 will be called row electrodes.

The free side of the layer 3 has electrodes, such as the electrode 4, which are linear and are orthogonal to the electrodes 1. These electrodes 4 will be called column electrodes.

A reading amplifier is connected to each line electrode (1).

To each column electrode 4 is connected a switch 10 by which the said column can be connected either to a reference potential such as the potential 0 or to a voltage generator 7 supplying a potential V.

During recording, all the row electrodes are at the potential zero, and all the columns are at the potential V. During reading, each line is connected to a charge amplifier, and all the columns are at the potential zero. It will be noted that, in this arrangement, all the rows can be connected without operations for switching over to the charge amplifiers, provided that the input potential of these amplifiers is zero, and provided that the amplifiers bear the variations in charges corresponding to the changes in potential imposed on the columns.

For the reading, the means for the thermal addressing of a sensor element will be described further below.

The charge created by the thermodielectric addressing of a sensor element appears at the capacitor C equal to the sum of the capacities of the sensor elements of one and the same line.

For a sensor element of 200×200 $\mu$m2, the minimum number of X-photons to be sensed is about 10. Assuming an overall yield by the photoconductor of 1000 electrons per X-photon absorbed, the minimum charge is:

$Q_{xmin}=10^4 e^-$, giving $Q_{xmin}=1.6\ 10^{-15}C$

The quantity of charges read is $q_{xmin}=sQ_{xmin}$. At ambient temperature, the capacity at the terminals of which this charge is equal to the effective fluctuation of the charge is equal to, for s=0.5:

$$C = \frac{q^2 \times \min}{KT} = 1,6\ 10^{-10}\ F.$$

Assuming that each row such as 1 comprises N=2000 sensor elements, the capacity per sensor element is:

$C_p=8.10^{-14}F.$

The least favorable case for the noise corresponds to the maximum capacity of a sensor element which is that of a photoconductor for a value $C_2$ near infinity.

For a thickness of $e_1=200$ microns, the maximum, dielectric constant of the photoconductor is:

$$\epsilon_{1max}\epsilon_0 = \frac{C_p \cdot e_1}{s} = \frac{8 \cdot 10^{-14}}{200 \cdot 10^{-6}}$$

whence $\epsilon_{1max}=40$.

The value of s=0.5 corresponds to the ratio:

$$\frac{C_2^M}{C_2^m} = \frac{\epsilon_2^M}{\epsilon_2^m} = 10.$$

By using the optimization relationship $C_2^M C_2^m = C_1^2$, we obtain, as indicated in the table below, for the photoconductors with permittivity values substantially equal to or below 40, the characteristics desired for the thermodielectric.

| | | $e_2 = 200\ \mu m$ | | $e_2 = 100\ \mu m$ | |
|---|---|---|---|---|---|
| Photoconductor | $\epsilon_1$ | $\epsilon_2^m$ | $\epsilon_2^M$ | $\epsilon_2^m$ | $\epsilon_2^M$ |
| Bi$_{12}$SiO$_{20}$(BSO) | 50 | 16 | 160 | 8 | 80 |
| Cd Te | 11 | 3,5 | 35 | 1,7 | 17 |
| PbO | 24 | 7,6 | 76 | 3,8 | 38 |
| a-Se | 7 | 2,2 | 22 | 1,1 | 11 |

For BSO and PbO, the range of dielectric constants is suited to the ferroelectric polymers of the P(VF$_2$/VF$_3$) family while for CdTe and a—Se, which have lower permittivities, these polymers would be suitable only in greater thicknesses, and this would limit the reading speed.

However, a smaller thickness than the optimum could be chosen without any notable loss of sensitivity. For example, in the previous examples, choosing a thickness of e=30 microns instead of 100 microns for the layer 3 of dielectric material would cause the sensitivity to be lowered by about 0.5 to 0.4. However, this would give the advantage of increasing the reading time by a factor of 9.

Since the dielectric has a free side and a side in contact with the photoconductor, heat will be applied through the free side. The duration of the heating pulse for the dielectric will be chosen, in a first approximation, as being equal to the propagation time of the heat wave in its thickness, i.e.:

$$t_c = \frac{e^2}{4D_T}$$

where
$D_T$ is the thermal diffusivity.
$DT \simeq 5 \ 10^{-8} m^2 s^{-1}$ for a ferroelectric polymer.
$DT \simeq 3 \ 10^{-7} m^2 s^{-1}$ for a ferroelectric oxide.
Taking, for example, a ferroelectric polymer with a thickness of 100 microns, we get:

$$t_c \simeq \frac{10^{-8}}{4 \times 5 \times 10^{-8}} \simeq 50 \text{ ms}$$

From this it is deduced that, in this case, the reading time for the 2000 columns is $t_2 = 2000 t_c = 100$ s.
The energy needed to heat a pixel is:

$$W = v.C\Delta T$$

where
v = volume of a sensor element
C = specific volumetric heat and
$\Delta T$ = rise in temperature for a volume $(100)^3 um^3 = 10^{-12} m^3$ $C = 2.4 \ 10^6 J.m^{-3} K^{-1}$ (polymer)

and
$\Delta T = 100°$
$W_c = 2.4 \ 10^{-4} J$
The necessary power is:

$$P_c = \frac{W_c}{t_c} = 5 \ 10^{-3} \text{ W}$$

giving for one column:

$P = 2000 P_c = 10$ W

Whatever the type of layer with an impedance which varies with the temperature, two modes of heating are contemplated: heating by the absorption of photons or heating by Joule effect. In view of the duration of the propagation of the thermal wave in the material with variable impedance, a collective columnwise thermal excitation rather than a point by point one will be chosen.

In the first mode of heating, the columns are lined with a layer which is absorbent with respect to the excitation wavelength; a laser beam deflected in x (rows) and y (columns) successively scans each column. Each column is scanned between 10 and 100 times during the propagation time of the thermal wave in the variable-impedance layer in such a way as to give a homogeneous heating all along this column.

This mode of functioning can be obtained with the mode of embodiment depicted in FIG. 10. The layer 3 and the column electrodes 4 are illuminated by a radiation R delivered by a source not depicted in the figure. The column electrodes 4 are lined with an absorbent layer by which it is possible to absorb the radiation photons R and to heat, in the layer 3, the material neighbouring these electrodes.

According to another alternative mode of embodiment, it is also possible to provide for a material of the layer 3 which absorbs the radiation R. It is then not obligatory to cover the column electrodes 4 with an absorbent material.

In the second mode of functioning, the column 4 electrodes are conductive and are heated by Joule effect, by causing them to be crossed by a current from a source which can deliver the necessary power per row (10 W in the preceding example). This alternative embodiment requires an access and a switching-over at each end of the column electrodes. However, this dual access to the column can be avoided by covering each column with another heating column, these two superimposed columns being separated by a thin-film dielectric.

Referring to FIG. 11, we shall describe the alternative embodiment in which it is planned that there will be a switching-over means at each end of the column conductors.

This figure again shows the sensor of FIG. 10 in which only one row electrode 1 and only one column electrode had been represented in order to simplify the said figure.

A first change-over switch 11 can be used to connect one end 40 of the column electrode 4 either to a zero potential or to a potential V supplied by a generator 7.

A second change-over switch 12 can be used either to connect the other end 41 of the column electrode 4 to a current generator 18 or to insulate it.

During a recording, the change-over switch 11 connects the end 40 of the column electrode 4 to the generator 7 which thus takes the electrode 4 to the potential V. The change-over switch 12 insulates the end 41 of the electrode 40. The recording by illumination of the sensor can then be done throughout the column located beneath the electrode 4.

During a reading, the change-over switch 12 connects the end 41 to the generator 18. A current flows in the column electrode 4 which gets heated and raises the temperature of the material of the layer 3. The reading of the detection point located at the intersection of the column electrode 4 with the row electrode 1 can be done by the amplifier 8.

Referring to FIG. 12, we shall now describe the alternative mode of embodiment in which the heating electrode is separated from the column electrode 4.

In this embodiment, we again have a row electrode 1, the layer 2 of photoconductive material, the layer 3 of material with an impedance that varies with the temperature, a column electrode that can be connected by a change-over switch 10, as in the example of the embodiment of FIG. 10, either to a zero potential or to a generator 7 giving a potential V.

A film 6 of a dielectric material lines the layer 3 and the column electrodes 4. On this film 6 is arranged a heating electrode 5. This electrode 5, one end of which is at a zero potential, can be connected at its other end to a current generator by means of a change-over switch 11.

During a recording, the change-over switch 10 connects the electrode 4 to the generator 7 and the electrode 5 is disconnected from the generator 18.

During a reading, the change-over switch 10 connects the electrode 4 to the zero potential while the change-over switch 11 connects the electrode 5 to the generator 18 which supplies a current causing the electrode 5 to be heated up.

It must be noted that in other alternative embodiments, not depicted, it is possible to provide for electrodes which cover the entire surface of the sensor. Especially, in the example of the embodiment of FIG. 10 where the heating by the radiation R can be done selectively, or else in the example of the embodiment of FIG. 12 where the heating electrodes 5 are separated from the column electrodes 4, it is possible to provide for an electrode covering the entire surface of the layer 3 made of a material with a variable impedance, instead of planning a series of column electrodes 4 which are parallel with one another.

What is claimed is:

1. Image sensor with nondestructible memory comprising:
   a first electrode made of a conductive material;
   a first layer of a photoconductive material in contact with the first electrode;
   a second transparent layer of a material with an impedance which is variable with the temperature, the said second layer being juxtaposed with the first layer of photoconductive material;
   a second transparent electrode made of a conductive material in contact with the said second layer;
   a recording voltage generator which can be connected with the said first and second electrodes;
   a charge amplifier, two inputs of which can be connected to the said first and second electrodes, and one output of which is connected to a charge sensor; with a first change-over switch making it possible to connect the recording voltage generator or the charge amplifier, as desired, to the said first and second electrodes; and
   a reading means including a heating means for heating the second layer at least at the location between the two said electrodes to read out recorded image information nondestructively;
   said image information recorded in the form of a charge distribution, which depends on illumination, at the interface of said first and second layers.

2. Image sensor with memory according to the claim 1, wherein the heating means comprise a laser source which emits a beam towards the second layer located between the first and second electrodes, and wherein the material of the said second layer is capable of absorbing the heating caused by the beam from the laser source.

3. Image sensor with memory according to the claim 2, wherein the heating means comprise at least one heating electrode.

4. Image sensor with memory according to the claim 3, wherein the heating means further comprise a laser source which emits a beam towards the heating electrode and wherein the said heating electrode is lined with a layer which is absorbent with respect to the wavelength of the said beam.

5. Image sensor with memory according to the claim 3, wherein the heating means further comprises a source of electric current for heating, connected to the heating electrode, and wherein this heating electrode is made of a conductive material and is heated by Joule effect when it is supplied with electric current.

6. Image sensor with memory according to the claim 5, wherein the heating electrode is superimposed on the second electrode with a layer of a dielectrical material separating the heating electrode and the second electrode.

7. Image sensor with memory according to the claim 3, wherein the second electrode is used as a heating electrode.

8. Image sensor with memory according to the claim 5, wherein:
   the second electrode is used as a heating electrode;
   a second change-over switch is used to connect a first terminal of this second electrode either to a terminal of the recording voltage generator during a recording operation or to a terminal of the electric current source during a reading operation;
   a third change-over switch is used either to insulate a second terminal of the second electrode during a recording operation or to connect it to another terminal of the electric current source during a reading operation.

9. Image sensor with memory according to the claim 1, wherein the second layer is made of a ferroelectric dielectric material.

10. Image sensor with memory according to the claim 1, wherein the said first and second electrodes as well as the said heating electrodes are rectilinear and parallel.

11. Image sensor with memory according to the claim 10, comprising several electrodes of various types all parallel with one another and parallel to the first and second layers, thus forming a recording and reading screen.

12. Image sensor with memory according to the claim 1, comprising several first electrodes which are parallel with one another and several second electrodes which are orthogonal to the first electrodes, a charge amplifier and a charge sensor being connected to each first electrode and a first change-over switch being associated with each second electrode to connect the corresponding second electrode, at choice, either to a recording voltage generator common to all the change-over switches or to the charge amplifiers.

13. A method for the sensing of image memories wherein a sensor including:
   a first electrode made of a conductive material,
   a first layer of photoconductive material in contact with the first electrode,
   a second transparent layer of a material with an impedance which is variable with the temperature, the said second layer being juxtaposed with the first layer of photoconductive material, and
   a second transparent electrode made of a conductive material in contact with the said second layer;
   is exposed to radiation determining, in the first layer of photoconductive material, a distribution of charges; and
   wherein nondestructible reading of the said distribution of charges is performed by heating the second layer of material which has an impedance variable with temperature and employing a charge amplifier connected to a charge sensor to measure charge.

* * * * *